United States Patent
Ovando Martinez

(10) Patent No.: US 11,047,895 B2
(45) Date of Patent: Jun. 29, 2021

(54) APPARATUS AND METHOD FOR LEAKAGE ELECTROMAGNETIC FIELD SENSING IN ELECTRICAL INDUCTIVE EQUIPMENT

(71) Applicant: Roberto B. B. Ovando Martinez, Milwaukee, WI (US)

(72) Inventor: Roberto B. B. Ovando Martinez, Milwaukee, WI (US)

(*) Notice: Subject to any disclaimer, the term of this patent is extended or adjusted under 35 U.S.C. 154(b) by 94 days.

(21) Appl. No.: 16/665,592

(22) Filed: Oct. 28, 2019

(65) Prior Publication Data
US 2021/0123960 A1 Apr. 29, 2021

(51) Int. Cl.
*G01R 29/08* (2006.01)

(52) U.S. Cl.
CPC ..... *G01R 29/0871* (2013.01); *G01R 29/0814* (2013.01); *G01R 29/0878* (2013.01)

(58) Field of Classification Search
CPC ............ G01R 29/0814; G01R 29/0898; G01R 33/032
See application file for complete search history.

(56) References Cited

U.S. PATENT DOCUMENTS

| | | | |
|---|---|---|---|
| 4,634,969 A | 1/1987 | Edlin et al. | |
| 5,432,437 A | 7/1995 | Turner | |
| 5,512,823 A | 4/1996 | Nepveu | |
| 6,486,664 B1 | 11/2002 | Metodiev et al. | |
| 2007/0177075 A1* | 8/2007 | Kimoto | A61B 5/062 349/110 |
| 2009/0013205 A1* | 1/2009 | Masugi | H04K 3/825 713/500 |
| 2009/0041380 A1* | 2/2009 | Watanabe | G06F 21/84 382/276 |
| 2011/0227559 A1* | 9/2011 | Miyazaki | G01R 29/0885 324/96 |

* cited by examiner

*Primary Examiner* — Alvaro E Fortich
(74) *Attorney, Agent, or Firm* — Ziolkowski Patent Solutions Group, SC

(57) ABSTRACT

A leakage electromagnetic field sensing device that determines a level of interference of a leakage electromagnetic field includes a sensor probe configured to measure the intensity and frequency of the leakage electromagnetic field, the sensor probe sensing three-axis components of the intensity. A data processing module operatively coupled to the sensor probe includes a processor programmed to analyze the three-axis components of the leakage electromagnetic field intensity to determine an absolute magnitude of the leakage electromagnetic field intensity and calculate a safety factor output based on the absolute magnitude of the intensity and on the frequency of the leakage electromagnetic field that indicates a level of interference to operation of an electronic device caused by the leakage electromagnetic field. A display element in operable communication with the processor illuminates in one of a plurality of colors based on a value of the safety factor output.

20 Claims, 5 Drawing Sheets

APPARATUS AND METHOD FOR LEAKAGE ELECTROMAGNETIC FIELD SENSING IN ELECTRICAL INDUCTIVE EQUIPMENT

BACKGROUND OF THE INVENTION

Embodiments of the invention relate to an apparatus and method for leakage electromagnetic field sensing in electrical inductive equipment such as electric transformers, electric motors, and high frequency electrical generators, among others. More particularly, embodiments of the invention relate to such an apparatus and method to measure the intensity and the frequency of the leakage electromagnetic field from electrical inductive equipment and for computing a safety factor therefrom that is indicative of the impact of the oscillated leakage electromagnetic energy on electronic devices carried by individuals in proximity to the electrical inductive equipment.

Eddy currents are induced in electrically conductive objects that are exposed to the leakage electromagnetic fields from electrical inductive equipment such as electric transformers, electric motors, and high frequency electrical generators, among others. Eddy currents generate Joule power losses that contribute to the increase in temperature of electrically conductive objects. Since the discovery of the relationship between electricity and magnetism with Michael Faraday in the $19^{th}$ century, electrical inductive equipment has been extensively used for electric power generation/transmission/transformation, electrical/mechanical transformation, among other applications, in diverse engineering disciplines such as automotive, aerospace, food industry, and any other field where the action of a magnetic field is required to accomplish a multidisciplinary application. In recent applications of the $20^{th}$ and $21^{st}$ century, electrical inductive equipment has expanded its applications to wireless transfer of power in phone chargers, inductive cooking stoves and sensors, among others.

Generally, electrical inductive equipment consists of a coil winding that is excited by a mechanical and/or an electronic oscillator that produces an alternating current (AC) in order to generate an oscillated electromagnetic field of a certain intensity and frequency (i.e., low-10 Hz to 20 kHz, medium-20 kHz to 100 kHz, or high-100 kHz to 10 MHz) to accomplish a multidisciplinary application. The alternating electromagnetic field can be used to transform the electrical energy into mechanical energy or vice versa in electrical motors and generators. The alternating electromagnetic field can also be used to step up or step down a voltage in a transformer for electrical insulative, transmission, and distribution purposes. Alternating electromagnetic fields can be also used to transfer wireless power to electrical conductive objects and/or to secondary open coils to produce Joule power losses and induced voltages that can be applied to change the temperature of a body and to store electrical energy in a battery bank, respectively. The magnitude of the transferred Joule power losses in electrical conductive objects by the leakage electromagnetic field is proportional to both the square of the intensity of the induced Eddy currents and the overall electrical resistance of the electrical conductive object.

It is recognized that operators (e.g., engineers, technicians, manufacturing and assembly workers, individuals in general, etc.) of electrical inductive equipment perform their duties in proximity and in exposure to the leakage electromagnetic fields that are generated by the electrical inductive equipment. Generally speaking, plastic guards and non-electrically conductive materials are typically used to prevent direct contact between the employees/individuals in general and the high voltage hazard connections in the electrical inductive equipment. However, the safety guards do not offer any protection against the leakage electromagnetic fields that are disperse and distributed around the electrical inductive equipment. The leakage electromagnetic fields that are produced by the electrical inductive equipment distribute in the space and interact with the electrically conductive and magnetic objects. Depending on the intensity and the frequency of the leakage electromagnetic fields, the electrical inductive equipment can affect the overall performance of portable electronic devices such as calculators, cellphones, computers, magnetic sensors, and in worst case scenarios, biological metal implants, pacemakers, and hearing amplifiers, among others, that are frequently used by employees and individuals in general in the proximity of the electrical inductive equipment. Therefore, a common concern from users of electrical inductive equipment is how close can they be to the electrical inductive equipment. Regular procedures tend to answer the above question by suggesting vaguely to the operators and individuals in general not to get close to or touch the electrical inductive equipment—without any accurate reference or vague distance of safety.

Therefore, it is desirable to provide an apparatus and method that provides a straightforward feedback to the employees and individuals in general regarding how close they can be to the electrical inductive equipment. Such an apparatus and method should provide this feedback in an accurate and straightforward manner and must require minimal input from a wearer—such as only requiring the wearer to turn on/off the apparatus.

BRIEF DESCRIPTION OF THE INVENTION

In accordance with one aspect of the invention, a leakage electromagnetic field sensing device includes a sensor probe configured to measure an intensity and frequency of a leakage electromagnetic field, the sensor probe sensing three-axis components of the leakage electromagnetic field intensity. The leakage electromagnetic field sensing device also includes a data processing module operatively coupled to the sensor probe, with the data processing module including a processor programmed to analyze the three-axis components of the leakage electromagnetic field intensity to determine an absolute magnitude of the leakage electromagnetic field intensity and calculate a safety factor output based on the absolute magnitude of the leakage electromagnetic field intensity and the frequency of the leakage electromagnetic field, the safety factor indicating a level of interference to operation of an electronic device caused by the leakage electromagnetic field. The data processing module also includes a display element in operable communication with the processor, the display element configured to illuminate in one of a plurality of colors based on a value of the safety factor output.

In accordance with another aspect of the invention, a method of operating a leakage electromagnetic field sensing device to determine a level of interference of a leakage electromagnetic field on operation of an electronic device is provided. The method includes measuring, via a sensor probe of the leakage electromagnetic field sensing device, an intensity and frequency of a leakage electromagnetic field, the sensor probe sensing three-axis components of the leakage electromagnetic field intensity. The method also includes analyzing, via a data processing module of the leakage electromagnetic field sensing device, the three-axis components of the leakage electromagnetic field intensity to determine an absolute magnitude of the leakage electromagnetic field intensity. The method further includes calculating, via the data processing module, a safety factor output based on the absolute magnitude of the leakage electromagnetic field intensity and the frequency of the leakage electromagnetic field, the safety factor indicating the level of interference to operation of the electronic device caused by the leakage electromagnetic field. The method still further includes illuminating a visual indicator of the leakage electromagnetic field sensing device in one of a plurality of colors based on a value of the safety factor output.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the invention are directed to an apparatus and method for the sensing of the leakage electromagnetic fields that are produced in electrical inductive equipment. More particularly, embodiments of the invention relate to such an apparatus and method for measuring the intensity and the frequency of the oscillated leakage electromagnetic field from electrical inductive equipment as well as to compute a safety factor therefrom that is indicative of the impact of the oscillated leakage electromagnetic energy on electronic devices carried by individuals in proximity to electrical inductive equipment.

Figure 1:
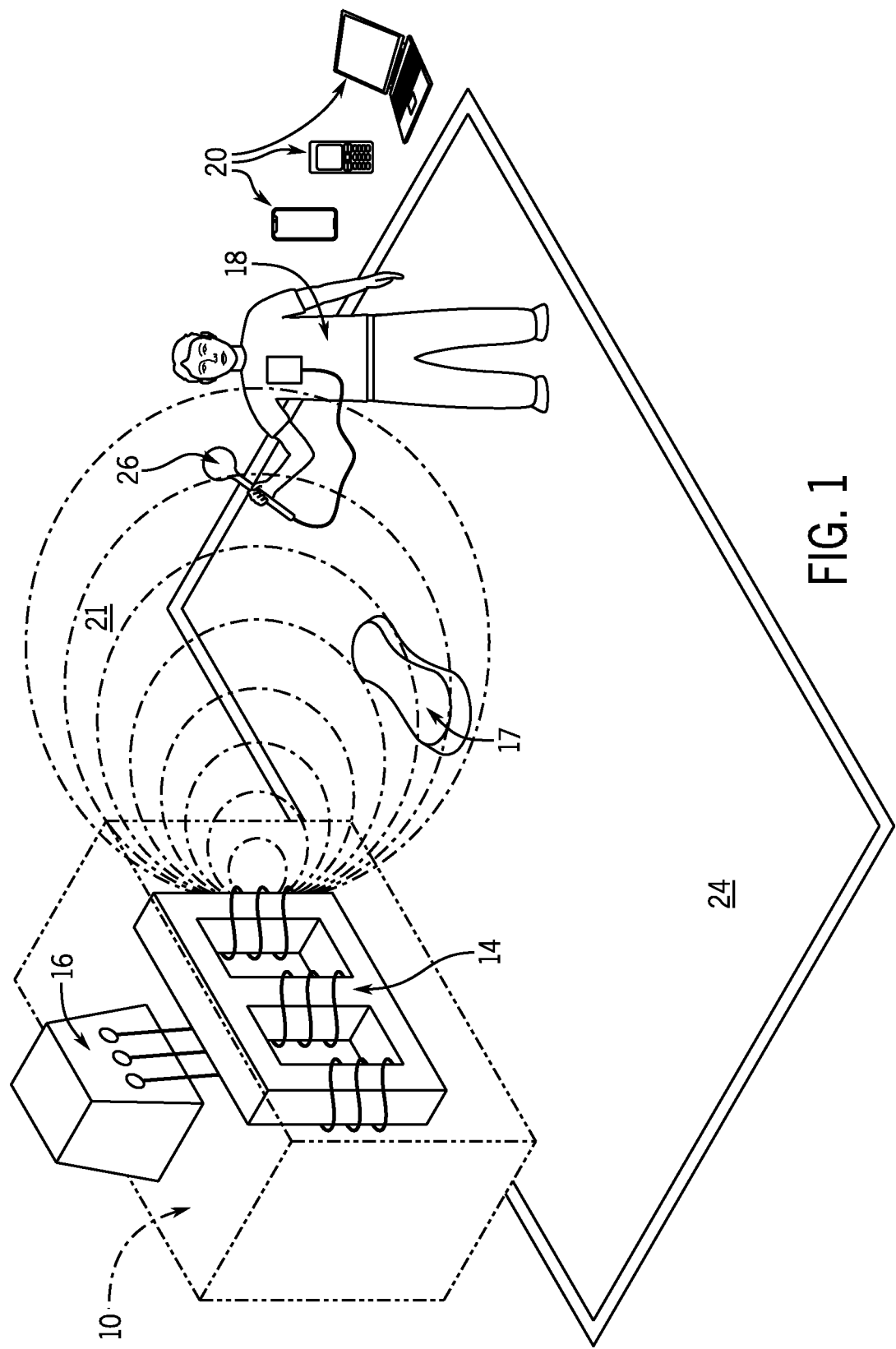
FIG. 1 is a pictorial view of electrical inductive equipment and a surrounding environment, with which embodiments of the invention may be implemented.

Referring to FIG. 1, the general environment of electrical inductive equipment 10 is illustrated with which embodiments of the invention may be implemented. The electrical inductive equipment 10 includes a coil and/or source of magnetic fields 14, along with a mechanical and/or electronic oscillator 16 that are commonly enclosed in a protective box. The mechanical and/or electronic oscillator 16 generates alternating electric current (AC) at the terminals of the coils/source of magnetic fields 14 in order to accomplish a multidisciplinary task. The leakage electromagnetic field generated by the electrical inductive equipment 10, indicated at 21, corresponds to the amount of wasted electromagnetic energy that is not being used to accomplish a multidisciplinary task. The leakage electromagnetic field 21 has the same frequency as that of the electromagnetic energy that is being used to perform a job (i.e., low 10 Hz to 20 kHz, medium 20 kHz to 100 kHz, or high 100 kHz to 10 MHz). The alternating leakage electromagnetic field 21 penetrates an electrically conducting object 17 (usually a metal), and generates electric currents inside the object 17 (i.e., eddy currents) that tend to increase the temperature and/or affect the performance of the object 17 due to the Joule power losses and the induced Eddy currents.

As it is shown in FIG. 1, an electrical inductive equipment operator 18 (or other individual) may be in proximity to the electrical inductive equipment 10, such that equipment or devices 20 worn by the operator 18 are exposed to the leakage electromagnetic field 21 from the electrical inductive equipment 10. The leakage electromagnetic field that is generated from the electrical inductive equipment coils 14 can be either used or not for the purpose to transfer/transform electrical power to an electrically conductive object 17 (work load) to perform a job. The leakage electromagnetic field distributes within a space/area 24 around the electrical inductive equipment 10 and interacts with the equipment/devices 20 worn or carried by the operator 18 (or other individual)—including portable electronic devices such as calculators, cellphones, computers, magnetic sensors, or possibly biological metal implants, pacemakers, hearing amplifiers, or other personal care devices. Depending on the interaction of the intensity and the frequency of the leakage electromagnetic field 21, the performance of the equipment/devices may be affected.

According to embodiments of the invention, a leakage electromagnetic field sensing device 26 may thus be worn by operator 18 for measuring the intensity and the frequency of the leakage electromagnetic field 21 from the electrical inductive equipment 10, with the sensing device 26 computing a safety factor therefrom that is indicative of the impact of the leakage electromagnetic field intensity and frequency on the electronic devices/equipment 20 carried by the operator 18. The safety factor is computed by the equation:

$$SF = \frac{B_m^2 \sqrt{F_m}}{B_c^2 \sqrt{F_c}} \cdot 100\%, \quad \text{[Eqn. 1]}$$

where SF refers to the safety factor in percentage, Bc and Fc are the magnetic flux density and frequency, respectively, that were found to impact the performance of the electronic devices/equipment 20 during calibration (threshold value), whereas Bm and Fm are the leakage magnetic flux density and frequency that the operator is measuring with the sensing device 26.

Figure 2:
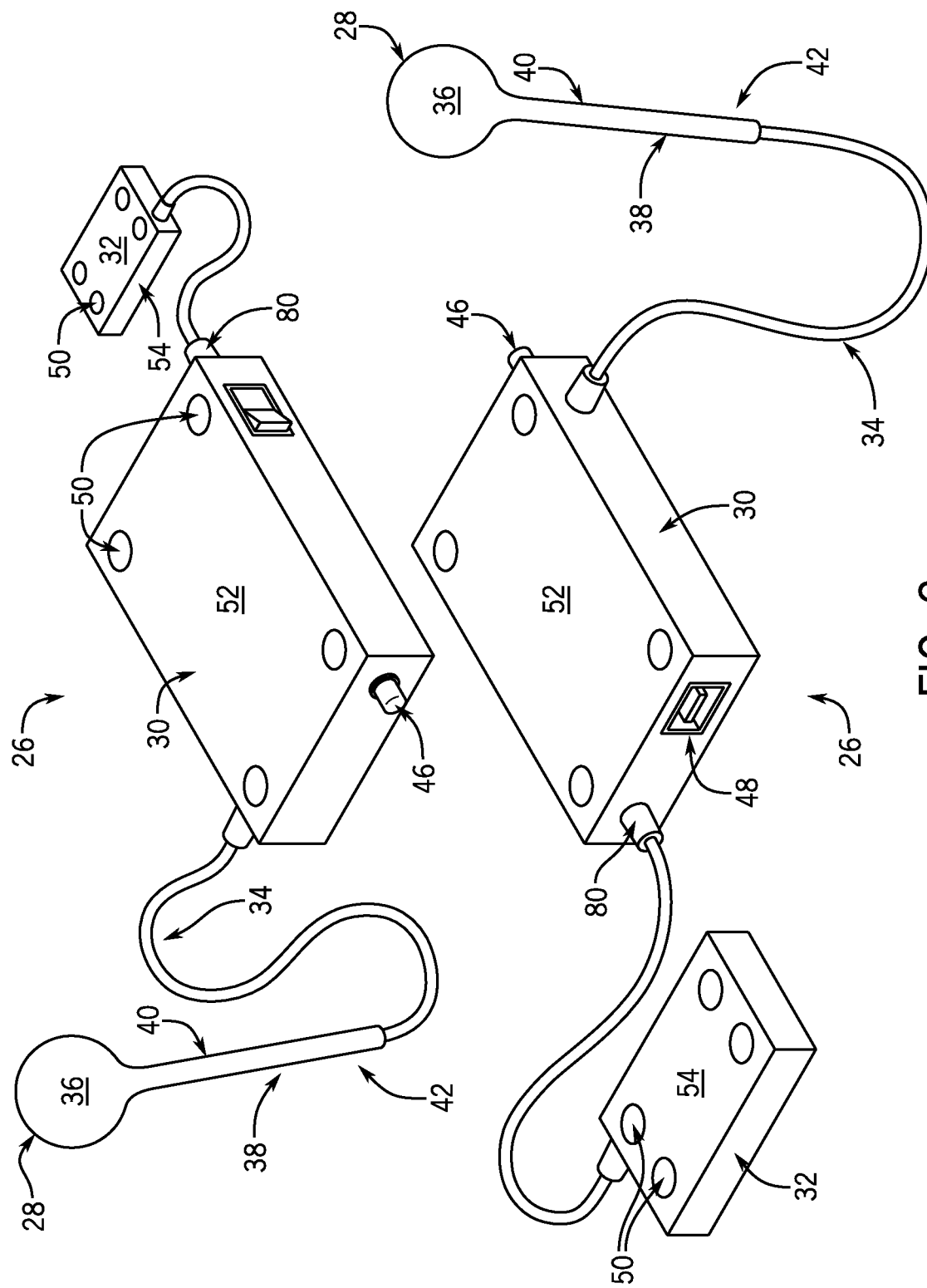
FIG. 2 is a perspective view of a leakage electromagnetic field sensing device useable with the system of FIG. 1, according to an embodiment of the invention.
Figure 3:
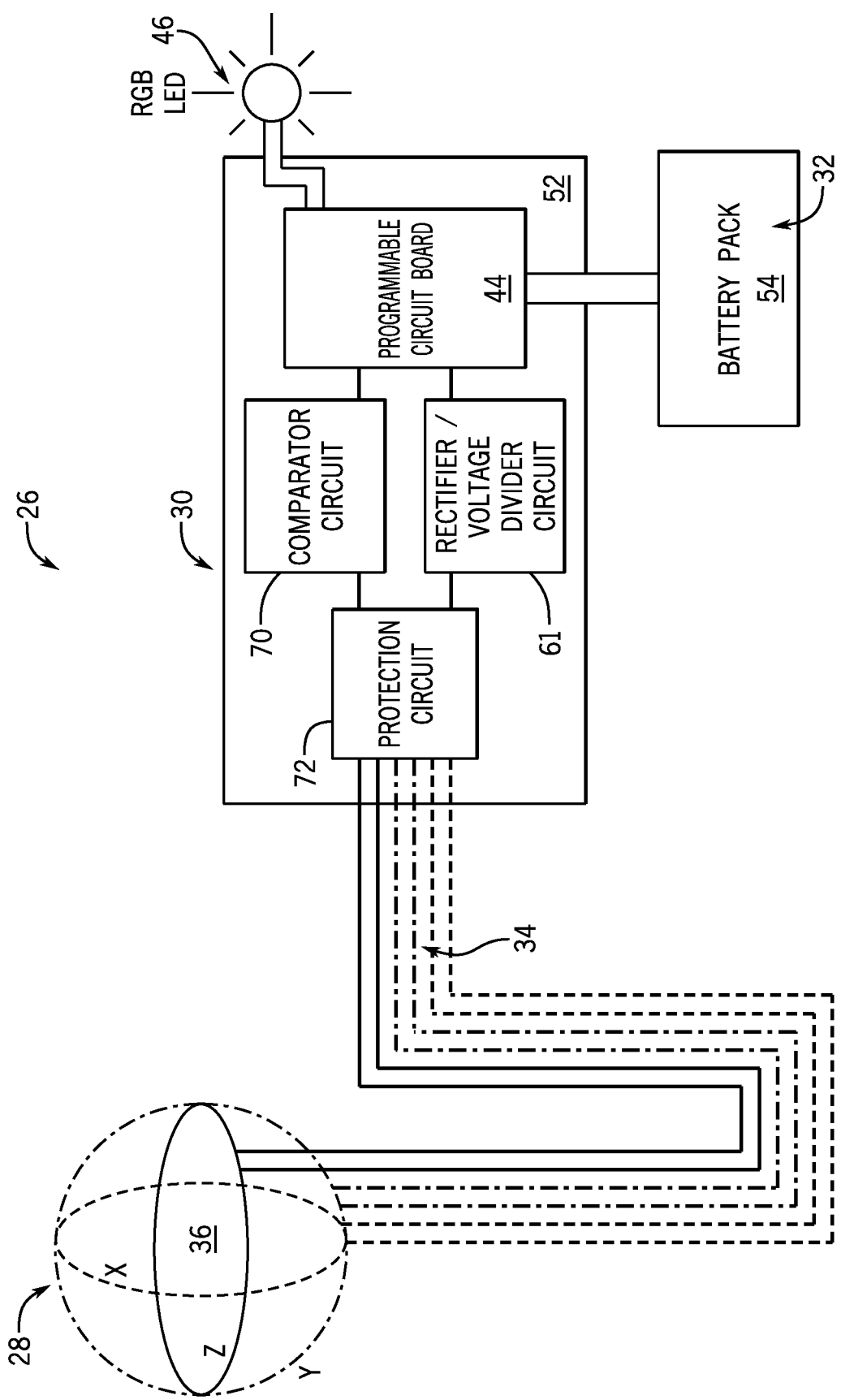
FIG. 3 is a block schematic diagram of the leakage electromagnetic field sensing device of FIG. 2.

A more detailed view of the sensing device 26 is illustrated in FIGS. 2 and 3, according to an embodiment of the invention. As shown in FIGS. 2 and 3, the leakage electromagnetic field sensing device 26 is generally composed of a sensor probe 28, a data processing module 30 in operable communication with the sensor probe 28 to receive data/readings therefrom, and a battery pack/charger 32 that provides power to the components of the leakage electromagnetic field sensing device 26 through a connection terminal 80. The sensor probe 28, data processing module 30, and battery pack/charger 32 of the sensing device 26 may be coupled by wired or wireless connections to provide for transfer of data and/or power therebetween, with the sensing device 26 being sized and configured to be wearable by the operator 18 as a portable device. In an embodiment where wired connections are included in the leakage electromagnetic field sensing device 26, the connecting wires 34 (such as from sensor probe 28 to data processing module 30) may be shielded wires that avoid induced voltage pick-up from the electrical inductive equipment 10.

With regard to sensor probe 28, the sensor probe 28 functions to capture the intensity and the frequency of the leakage electromagnetic field from the electrical inductive equipment 10 during operation thereof, with it being recognized that the generation/transfer of Joule power losses from the electrical inductive equipment 10 to the object being induced 17 is not only a function of the magnitude of the leakage magnetic field intensity, but also a function of the frequency (due to the skin depth phenomenon that takes place in electrical conductive objects that changes the effective magnitude of the electrical resistance in the induced object). The sensor probe 28 comprises an arrangement of three electromagnetic field sensing coils 36 to sense the X, Y, and Z components of the leakage electromagnetic field (i.e., a 3-axis probe). The size and the number of turns of the sensing coils 36 is designed taking into account the maximum and minimum frequency of the leakage electromagnetic field to be measured, as well as the maximum voltage limiting factor of the circuitry in the data processing module 30. For example, the sensing coils 36 may have a diameter of 1.5 inches and 10 turns for sensing frequencies between 10 kHz to 600 kHz. According to one embodiment, the coils 36 are mounted on an electrically insulated rod 38 on a first end 40 thereof, which is opposite from a second end 42 of the insulated rod 38 that is connected to output wire 34 that extends from the sensor probe 28 to the data processing module 30. The configuration of the sensor probe 28—with coils 36 mounted on the first end 40 of rod 38—provides protection to the operator 18 during use of the sensing device 26 and allows positioning of the sensor probe 28 close to the coil/sources of magnetic field 14, while keeping the data processing module 30 distal from the electromagnetic source. In operation, the sensing coils 36 of the sensor probe 28 sense the three-axis components Bx, By, Bz of the leakage electromagnetic field intensity and the frequency of the signal from the electrical inductive equipment 10. The leakage electromagnetic field intensity provides a corresponding voltage value according to the well-known formula V=N∂φ/∂t, where V is the output voltage from the sensing coils, N is the number of turns in the sensing coil, and φ is the magnitude of the sensed leakage magnetic flux. The sensed voltage value that is output from the sensor probe 28 provides to the data processing module 30 an indication of the measured leakage magnetic field intensity, along with the frequency reading acquired by the sensor probe 28.

With regard to data processing module 30, the data processing module 30 functions to receive the leakage magnetic field intensity and the frequency acquired by the sensor probe 28 and process that data in order to compute and output a safety factor that alerts when a combination of the leakage magnetic flux density (intensity) and the frequency produced by the electrical inductive equipment 10 have reached a pre-determined percentage of a safety factor limit that can affect the proper operation of electronic devices 20, such as calculators, laptops, cellphones, magnetic sensors, metal implants, peace makers, aid hearing devices, etc. For performing such functions, data processing module 30 comprises a programmable circuit board 44 (that may comprise one or more processors), a comparator circuit 70, and a rectifier/voltage divider circuit 61 operable to get/analyze/process the analog and digital data that is provided by sensor probe 28. The data processing module 30 also comprises a display element 46—such as a light emitting diode (LED) display 46 with an RGB LED—that provides a visible output or alert to the operator 18 of the calculated safety factor. There are multiple circuits that can be implemented by those skilled in the art of electronic engineering after reading this specification to perform the analogous functions of the comparator circuit 70 and the rectifier/voltage divider circuit 61.

In processing the data received from sensor probe 28, the data processing module 30 (i.e., programmable circuit board 44 therein) analyzes the three components Bx, By, Bz of the leakage magnetic field intensity to compute an absolute magnitude of the leakage magnetic field intensity in a point of the space according to the equation:

$$B_m = \sqrt{Bx^2 + By^2 + Bz^2} \quad \text{[Eqn. 2]},$$

where Bm is the absolute magnitude of the leakage magnetic field vector in a point of the space. By calculating the absolute magnitude of the leakage magnetic field intensity, the need for an operator 18 to rotate the sensor probe 28 in order to determine peak readings of the leakage magnetic flux density is negated, beneficially providing for the elimination of "user error" when determining the safety factor. The data processing module 30 (i.e., programmable circuit board 44 therein) also analyzes the three components Bx, By, Bz of the leakage magnetic field intensity to determine the direction and frequency of the leakage magnetic field vector in a point of the space around the electrical inductive equipment 10.

Upon a determination of the absolute magnitude of the leakage magnetic field intensity and the frequency of the signal that is produced in the surrounding space from the electrical inductive equipment 10, the data processing module 30 (i.e., programmable circuit board 44 therein) then utilizes such values to calculate a safety factor output according to Equation [1]:

$$SF = \frac{B_m^2 \sqrt{F_m}}{B_c^2 \sqrt{F_c}} \cdot 100\%.$$

The safety factor output SF is indicative of the effect that the combination of the leakage magnetic flux density and the frequency produced by the electrical inductive equipment 10 will have on electronic devices 20 worn or used by the operator 18. In determining the safety factor output SF, the data processing module 30 first needs a calibration of the leakage electromagnetic field sensing device 26 in order to set or establish a threshold value of:

$$B_c^2 \sqrt{F_c}$$

(safety factor limit), to which the measured/sensed sensor probe 28 readings Bm, Fm may be compared. According to an exemplary embodiment, a single calibration of the leakage electromagnetic field sensing device 26 is performed at/in a known magnetic field intensity and at one known arbitrary frequency, in order to establish the threshold value $$B_c^2 \sqrt{F_c}$$

(safety factor limit). That is, a calibration at each of a plurality of frequencies is not required, as it is recognized that the amount of Joule power losses and the magnitude of the Eddy currents induced in the object by induction is the same at any two or more different frequencies as long as the combination of the product of the magnetic energy times the square root of the frequency is the same in any frequency of operation. According to one embodiment, the established threshold value $$B_c^2 \sqrt{F_c}$$

(safety factor limit) set during calibration of the leakage electromagnetic field sensing device 26 may be tied to a particular type or types of devices worn/carried by the operator 18 based on the sensitivity of such device(s). As an example, the established threshold value (safety factor limit) may be tied to calculators and cellphones. Alternatively, the established threshold value (safety factor limit) may be tied to more complex electronic devices such as hearing amplifiers, pacemakers, and/or biological metal implants, among others.

Upon a determination of the safety factor limit via calibration, the established safety factor limit threshold is then compared with a safety factor reading derived from the acquired/determined leakage magnetic field intensity and frequency. A ratio of the safety factor reading (from the acquired/determined leakage magnetic field intensity and frequency) to the safety factor limit threshold value is then determined to derive the safety factor output SF according to Equation [1]:

$$SF = \frac{B_m^2 \sqrt{F_m}}{B_c^2 \sqrt{F_c}} \cdot 100\%.$$

The safety factor output from the programmable circuit board 44 is generated in the form of a color-coded LED light or display 46 that is indicative of the impact/effect that the combination of the leakage magnetic flux density and the frequency, that are produced by the electrical inductive equipment 10, will have on electronic devices 20 worn or used by the operator 18.

An exemplary embodiment of the Safety Factor Output generated by the data processing module 30 is described here below regarding the color-coding of various safety factor levels that might be displayed by the LED display 46, with the magnitude of the Safety Factor Output being translated into a color that will be displayed with the implementation of a RGB LED. The LED display 46 will illuminate in green when it is determined by the data processing module 30 that there is no a leakage electromagnetic field present—indicating a "SAFE ZONE" for the electronic devices used by the operator 18. The LED display 46 will illuminate in yellow when it is determined by the data processing module 30 that there is a combination of leakage electromagnetic field and frequency that does not represent a hazard/interference for portable electronic devices 20 worn by the operator 18 (i.e., does not affect the performance of the electronic devices worn by the operator 18)—with the Safety Factor Output indicating a "WARNING ZONE" for the electronic devices 20 used by the operator 18. The LED display 46 will illuminate in red when it is determined by the data processing module 30 that there is a combination of leakage electromagnetic field and frequency that represent a hazard/interference for portable electronic devices 20 (i.e., affects the performance of the electronic devices worn by the operator 18)—with the Safety Factor Output indicating a "RISK ZONE" for the electronic devices 20 used by the operator 18. As the Safety Factor Output increases beyond the value/magnitude associated with the "RISK ZONE", the LED display 46 will illuminate in red and begin blinking—indicating a "HIGH RISK ZONE" for the electronic devices 20 used by the operator 18. Finally, as the Safety Factor Output increases beyond the value/magnitude associated with the "HIGH RISK ZONE," the LED display 46 will illuminate in blue—indicating a "MOVE AWAY ZONE" from which the electronic devices 20 used by the operator 18 as well as the sensor probe 28 should be removed. The Safety Factor Output associated with the "MOVE AWAY ZONE" may correspond to measured voltages associated with the leakage magnetic field being 50V or higher voltages that are close to the voltage limiting factor of the circuitry that is used in both the comparator circuit 70 and the rectifier/voltage divider circuit 61 that are included in the data processing module 30. However, the invention is not restricted to a 50 V circuitry voltage and those skilled in the art of electronic engineering can implement the invention to work with tens or hundreds of volts as a limiting factor after reading this specification. When reaching a Safety Factor Output associated with the "MOVE AWAY ZONE", the leakage electromagnetic field sensing device 26 will automatically trip by using the protection circuit 72 to provide an overvoltage safeguard to the sensing device 26 itself, with the leakage electromagnetic field sensing device 26 then restoring itself after a pre-defined period of time (e.g., 10 seconds).

While the above list of specified colors is set forth as corresponding to the indicated safety factor outputs, it is recognized that embodiments of the invention may utilize other colors alternative to those indicated. Additionally, it is recognized that additional forms of alerts may be generated in addition to the color-coded LED display 46 described, such as audible alerts being combined with the visual indicators for certain safety factor output levels, for example.

According to embodiments of the invention, additional features and components may be included in the leakage electromagnetic field sensing device 26 in order to further improve the usability of the device.

In one embodiment, the data processing module 30 includes a USB port 48 that provides for data and/or power communications to and from the data processing module 30 with an external device such as a computer (not shown). The USB port 48 may also function as an input that enables charging of the leakage electromagnetic field sensing device 26 from an external device, such as a computer, when a battery or a cord charger is not at hand (connected at 80). The USB port 48 may also enable an output of the calculated safety factor to an external device, such as a computer, in real-time. The computed data in the module 30 may be provided to a computer for real-time plotting of information of interest such as the safety factor, the leakage magnetic field intensity (module of the vector Bx, By, Bz), and the frequency. Still further, the USB port 48 allows for software updates to be loaded onto the leakage electromagnetic field sensing device 26. As one example, and as described above, updates may be provided to the data processing module 30 regarding calibration of the leakage electromagnetic field sensing device 26—with the updates directed to threshold values (safety factor limits) tied to additional types of devices, including complex electronic devices such as hearing amplifiers, pacemakers, and/or biological metal implants, among others.

Figure 4:
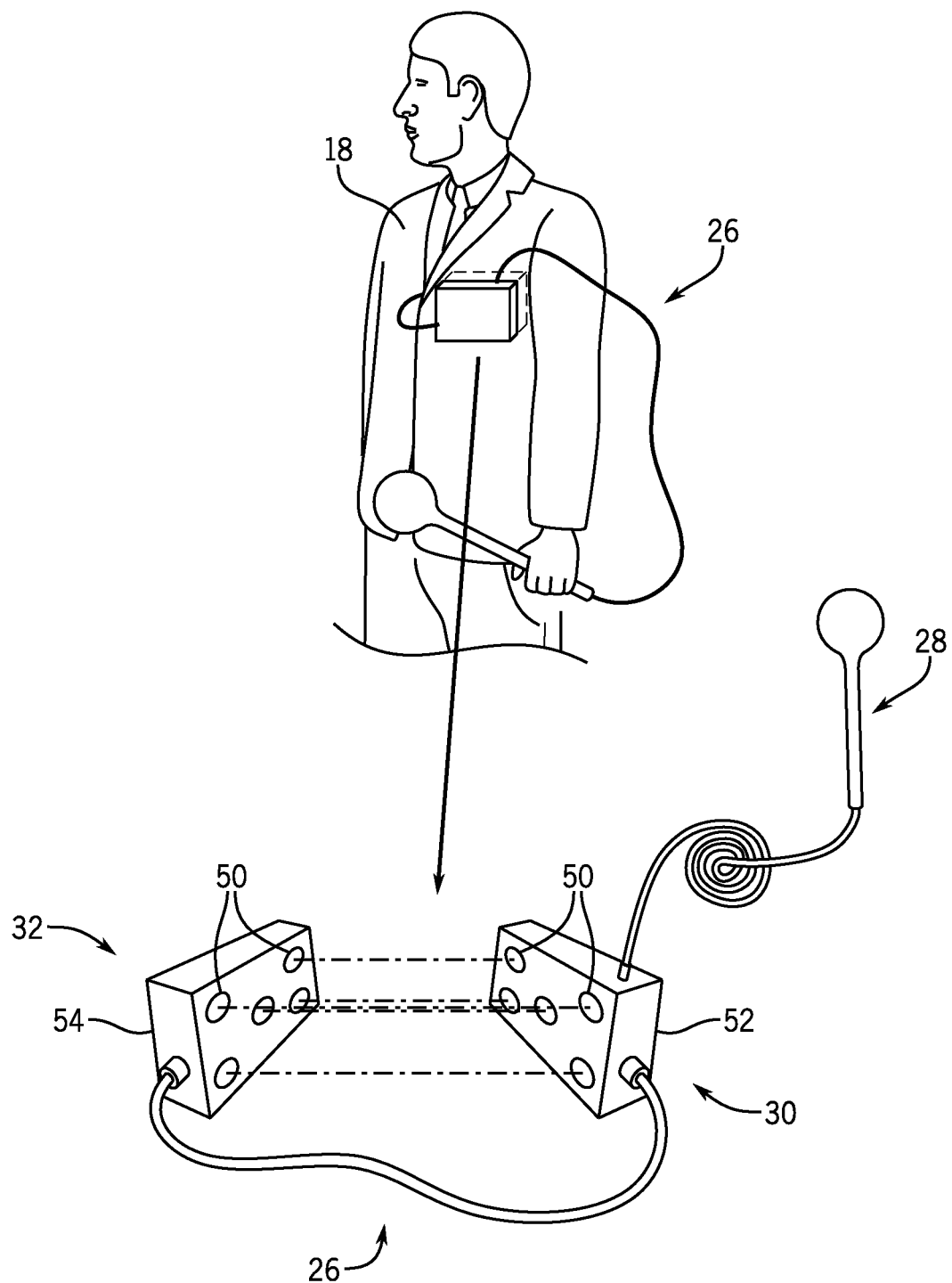
FIG. 4 is a perspective view of the leakage electromagnetic field sensing device of FIG. 2 being worn by an operator.

In one embodiment, each of the data processing module 30 and the battery pack/charger 32 includes magnets 50 attached to an outer housing thereof (i.e., to data processing module housing 52 and battery pack/charger housing 54), as best shown in FIG. 2. The magnets 50 are attached at the bottom of the housings 52 and 54 to provide means of holding the data processing module 30 and/or battery pack/charger 32 against metallic surfaces and/or against the operator's clothes. The magnets 50 on the data processing module housing 52 and battery pack/charger housing 54 are configured to attract to each other (i.e., have opposite polarities), such that the operator 18 can place their shirt, pants pockets, or belt in between the magnets 50 to attach the data processing module 30 and battery pack 32 to their body in a secure manner, as shown in FIG. 4, providing the freedom to move around with the leakage electromagnetic field sensing device 26.

Figure 5:
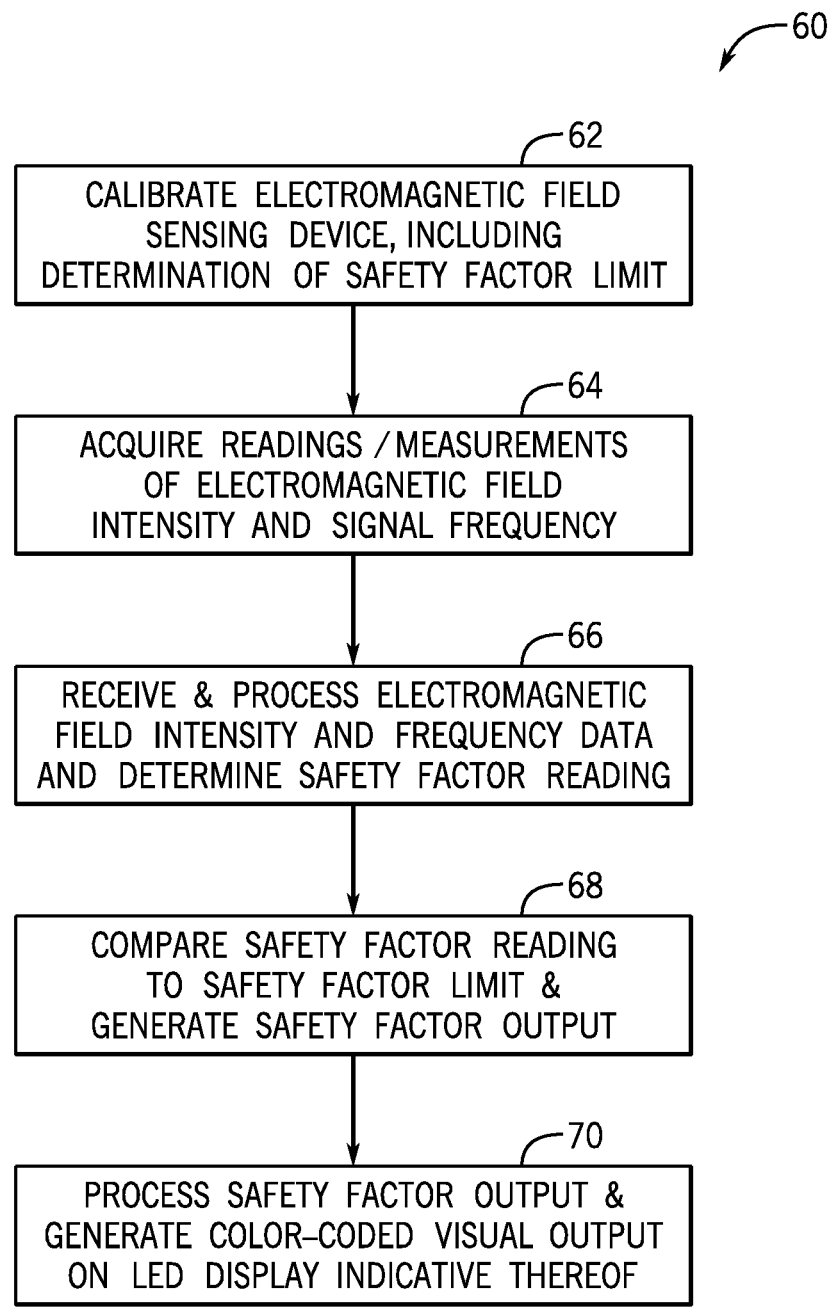
FIG. 5 is a flowchart illustrating a process for a determining a safety factor indicative of an impact of the leakage electromagnetic energy on electronic devices carried by individuals in proximity to the electrical inductive equipment, according to an embodiment of the invention.

Referring now to FIG. 5, and with continued reference to FIGS. 1-4, a flowchart illustrating a technique 60 for measuring the intensity and the frequency of the leakage electromagnetic field from electrical inductive equipment 10 and computing a safety factor therefrom is provided, according to an embodiment of the invention. The computed safety factor is indicative of an impact of the leakage electromagnetic energy on electronic devices carried by individuals in proximity to the electrical inductive equipment, with an alert being generated for the individual indicating the level of impact of the leakage electromagnetic field intensity and frequency on equipment/devices carried on or by the individual.

The technique 60 begins at STEP 62 with a calibration of the leakage electromagnetic field sensing device 26 being performed. In performing the calibration, a threshold value (safety factor limit) is established for a known intensity and known arbitrary frequency of a leakage electromagnetic field that is generated by the electrical inductive equipment 10—with the sensor probe 28 of the leakage electromagnetic field sensing device 26 acquiring readings/measurements of the intensity and the frequency of the leakage electromagnetic field at known levels. The leakage electromagnetic field sensing device 26 may thus be calibrated based on the known intensity of the leakage electromagnetic field and the frequency values that were observed to impact negatively the performance of the electronic devices/equipment 20 worn by the operator 18.

Upon calibration of the leakage electromagnetic field sensing device 26, the technique 60 continues at STEP 64 with sensor probe 28 of leakage electromagnetic field sensing device 26 acquiring readings/measurements of the intensity and the frequency of the leakage electromagnetic field generated by the electrical inductive equipment 10 during operation thereof. The measurements acquired by the sensor probe 28 comprise the three-axis components Bx, By and Bz of the leakage magnetic field intensity and the frequency of the signal from the electrical inductive equipment 10. The leakage magnetic field intensity provides a corresponding voltage value that is output from the sensor probe 28 and processed at the rectifier/voltage divider circuit 61, along with the frequency reading that is both acquired by the sensor probe 28 and processed by the comparator circuit 70, as indicated at STEP 64.

At STEP 66, the data processing module 30 receives the leakage magnetic field intensity and frequency data from both the rectifier/voltage divider circuit 61 and the comparator circuit 70 to compute a safety factor reading. In an exemplary embodiment, the data processing module 30 (i.e., programmable circuit board 44 therein) analyzes the three components Bx, By and Bz of the leakage magnetic field intensity to compute an absolute magnitude of the leakage magnetic field intensity in a point of space surrounding the electrical inductive equipment 10. The data processing module 30 also analyzes the three components Bx, By and Bz of the leakage magnetic field intensity to determine the direction and frequency of the leakage magnetic field vector from the electrical inductive equipment 10. The absolute magnitude of the leakage magnetic field intensity and the frequency of the signal is used at STEP 66 to determine a safety factor reading therefrom.

Upon a determination of the safety factor reading at STEP 66 (as derived from the absolute magnitude of the leakage magnetic field intensity and the frequency of the signal from the electrical inductive equipment 10), the technique 60 continues to STEP 68, where the data processing module 30 compares the safety factor reading (established at STEP 66) to the safety factor limit (established at STEP 62) to calculate a safety factor output indicative of the effect that the combination of the leakage magnetic flux density and the frequency produced by the electrical inductive equipment 10 will have on electronic devices worn or used by the operator 18. A ratio of the safety factor reading (from the acquired/determined leakage magnetic field intensity and frequency) to the safety factor limit threshold value is determined at STEP 68 to derive the safety factor output according to Equation [1]:

$$SF = \frac{B_m^2 \sqrt{F_m}}{B_c^2 \sqrt{F_c}} \cdot 100\%.$$

The safety factor output is processed at STEP 70 to generate a color-coded visual output that is indicative of the effect that the combination of the leakage magnetic flux density and the frequency produced by the electrical inductive equipment 10 will have on electronic devices 20 worn or used by the operator 18. The color-coded output may be generated in the form of a color-coded LED indicator displayed on the LED display, with the magnitude of the Safety Factor Output being translated into a specified color that will be displayed with an RGB LED light. According to one embodiment, the LED display will illuminate in green when it is determined by data processing module 30 that there is no leakage electromagnetic field present—indicating a "SAFE ZONE" for the electronic devices worn by the operator 18. The LED display will illuminate in yellow when it is determined by the data processing module 30 that there is a combination of leakage electromagnetic field and frequency that does not represent a hazard/interference for portable electronic devices 20 (i.e., does not affect the performance of the electronic devices)—with the Safety Factor Output indicating a "WARNING ZONE" for the electronic devices 20 used by the operator 18. The LED display will illuminate in red when it is determined by the data processing module 30 that there is a combination of leakage electromagnetic field and frequency that represents a hazard/interference for portable electronic devices 20 (i.e., affects the performance of the electronic devices)—with the Safety Factor Output indicating a "RISK ZONE" for the electronic devices 20 used by the operator 18. As the Safety Factor Output increases beyond the value/magnitude associated with the "RISK ZONE", the LED display will illuminate in red and begin blinking—indicating a "HIGH RISK ZONE" for the electronic devices 20 used by the operator 18. Finally, as the Safety Factor Output increases beyond the value/magnitude associated with the "HIGH RISK ZONE," the LED display will illuminate in blue—indicating a "MOVE AWAY ZONE" from which the electronic devices used by the operator 18, as well as the sensor probe 28, should be removed. When reaching a Safety Factor Output associated with the MOVE AWAY ZONE, the leakage electromagnetic field sensing device 26 will automatically trip to provide overvoltage protection to itself, with the leakage electromagnetic field sensing device 26 then restoring itself after a pre-defined period of time (e.g., 10 seconds).

Beneficially, embodiments of the invention thus provide an apparatus and method for computing a safety factor from a measured intensity and frequency of the leakage electromagnetic field generated by operation of electrical inductive equipment. The safety factor is indicative of an impact of the leakage electromagnetic energy on electronic devices carried by an individual in proximity to the electrical inductive equipment. The safety factor is output to an operator as a color-coded LED display that is indicative of the level of impact of the leakage electromagnetic energy on electronic devices carried by the operator in proximity to the electrical inductive equipment, thereby enabling the operator to determine a safe area of operation within which to position themselves and use electronic devices.

Other than an initial calibration of the leakage electromagnetic field sensing device, no additional inputs are required from an operator in order to generate the safety factor output—including there being no requirement for the operator to rotate the sensing device to a particular orientation in order to measure the leakage magnetic flux density. The leakage electromagnetic field sensing device may include self-protection features that cause the device to trip when the leakage electromagnetic field is at or greater than a specified intensity level.

Therefore, according to one embodiment of the invention, a leakage electromagnetic field sensing device includes a sensor probe configured to measure an intensity and frequency of a leakage electromagnetic field, the sensor probe sensing three-axis components of the leakage electromagnetic field intensity. The leakage electromagnetic field sensing device also includes a data processing module operatively coupled to the sensor probe, with the data processing module including a processor programmed to analyze the three-axis components of the leakage electromagnetic field intensity to determine an absolute magnitude of the leakage electromagnetic field intensity and calculate a safety factor output based on the absolute magnitude of the leakage electromagnetic field intensity and the frequency of the leakage electromagnetic field, the safety factor indicating a level of interference to operation of an electronic device caused by the leakage electromagnetic field. The data processing module also includes a display element in operable communication with the processor, the display element configured to illuminate in one of a plurality of colors based on a value of the safety factor output.

According to another embodiment of the invention, a method of operating a leakage electromagnetic field sensing device to determine a level of interference of a leakage electromagnetic field on operation of an electronic device is provided. The method includes measuring, via a sensor probe of the leakage electromagnetic field sensing device, an intensity and frequency of a leakage electromagnetic field, the sensor probe sensing three-axis components of the leakage electromagnetic field intensity. The method also includes analyzing, via a data processing module of the leakage electromagnetic field sensing device, the three-axis components of the leakage electromagnetic field intensity to determine an absolute magnitude of the leakage electromagnetic field intensity. The method further includes calculating, via the data processing module, a safety factor output based on the absolute magnitude of the leakage electromagnetic field intensity and the frequency of the leakage electromagnetic field, the safety factor indicating the level of interference to operation of the electronic device caused by the leakage electromagnetic field. The method still further includes illuminating a visual indicator of the leakage electromagnetic field sensing device in one of a plurality of colors based on a value of the safety factor output.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A leakage electromagnetic field sensing device comprising:
   a sensor probe configured to measure an intensity and frequency of a leakage electromagnetic field, the sensor probe sensing three-axis components of the leakage electromagnetic field intensity; and
   a data processing module operatively coupled to the sensor probe, the data processing module comprising:
      a processor programmed to:
         analyze the three-axis components of the leakage electromagnetic field intensity to determine an absolute magnitude of the leakage electromagnetic field intensity; and
         calculate a safety factor output based on the absolute magnitude of the leakage electromagnetic field intensity and the frequency of the leakage electromagnetic field, the safety factor indicating a level of interference to operation of an electronic device caused by the leakage electromagnetic field; and
      a display element in operable communication with the processor, the display element configured to illuminate in one of a plurality of colors based on a value of the safety factor output.

2. The leakage electromagnetic field sensing device of claim 1 wherein the processor is further programmed to perform an initial calibration of the leakage electromagnetic field sensing device, with the processor programmed to:
   acquire intensity and frequency readings from the sensor probe from an electromagnetic field of known intensity and frequency; and
   calculate a safety factor threshold value based on the acquired intensity and frequency readings.

3. The leakage electromagnetic field sensing device of claim 2 wherein, in calculating the safety factor output, the processor is further programmed to:
   determine a safety factor reading based on the absolute magnitude of the leakage electromagnetic field intensity and the frequency of the leakage electromagnetic field;
   determine a ratio of the safety factor reading to the safety factor threshold value; and
   calculate the safety factor output based on the ratio of the safety factor reading to the safety factor threshold value;

wherein the processor provides the safety factor output to the display element to cause the display element to illuminate in one of the plurality of colors.

4. The leakage electromagnetic field sensing device of claim 1 wherein the processor is further programmed to cause the leakage electromagnetic field sensing device to trip when the safety factor output is at or greater than a specified safety factor value, so as to provide self-protection of the leakage electromagnetic field sensing device.

5. The leakage electromagnetic field sensing device of claim 1 wherein the display element comprises a light emitting diode (LED) display configured to illuminate in one of the plurality of colors.

6. The leakage electromagnetic field sensing device of claim 1 wherein the sensor probe comprises:
   a first sensing coil configured to sense an x-axis component of the leakage electromagnetic field intensity;
   a second sensing coil configured to sense a y-axis component of the leakage electromagnetic field intensity; and
   a third sensing coil configured to sense a z-axis component of the leakage electromagnetic field intensity.

7. The leakage electromagnetic field sensing device of claim 6 wherein the sensor probe comprises a probe rod, wherein the first, second, and third sensing coils are positioned on a first end of the electrically insulated rod.

8. The leakage electromagnetic field sensing device of claim 7 further comprising a wired connection operatively coupling the sensor probe to the data processing module, the wired connection connected to the probe rod on a second end thereof opposite the first end.

9. The leakage electromagnetic field sensing device of claim 8 wherein the wired connection comprises a shielded wire connection.

10. The leakage electromagnetic field sensing device of claim 1 wherein the leakage electromagnetic field sensing device comprises a portable device wearable by a user, the portable device comprising a battery pack/charger.

11. The leakage electromagnetic field sensing device of claim 10 wherein each of the data processing module and the battery pack/charger comprises a housing having a plurality of magnets affixed thereto, the plurality of magnets on the data processing module housing and the plurality of magnets on the battery pack housing having opposite polarities such that the data processing module can be secured to the battery pack/charger, so as to secure the leakage electromagnetic field sensing device on the user.

12. The leakage electromagnetic field sensing device of claim 1 wherein the data processing module further comprises a USB port that enables data transfer from and to the data processing module, and enables charging of the leakage electromagnetic field sensing device.

13. The leakage electromagnetic field sensing device of claim 1 wherein the leakage electromagnetic field comprises a leakage electromagnetic field generated by operation of electrical inductive equipment.

14. A method of operating a leakage electromagnetic field sensing device to determine a level of interference of a leakage electromagnetic field on operation of an electronic device, the method comprising:
   measuring, via a sensor probe of the leakage electromagnetic field sensing device, an intensity and frequency of a leakage electromagnetic field, the sensor probe sensing three-axis components of the leakage electromagnetic field intensity;
   analyzing, via a data processing module of the leakage electromagnetic field sensing device, the three-axis components of the leakage electromagnetic field intensity to determine an absolute magnitude of the leakage electromagnetic field intensity;
   calculating, via the data processing module, a safety factor output based on the absolute magnitude of the leakage electromagnetic field intensity and the frequency of the leakage electromagnetic field, the safety factor indicating the level of interference to operation of the electronic device caused by the leakage electromagnetic field; and
   illuminating a visual indicator of the leakage electromagnetic field sensing device in one of a plurality of colors based on a value of the safety factor output.

15. The method of claim 14 further comprising performing an initial calibration of the leakage electromagnetic field sensing device, wherein performing the initial calibration comprises:
   acquiring, via the sensor probe, intensity and frequency readings of a leakage electromagnetic field of known intensity and frequency; and
   calculating, via the data processing module, a safety factor threshold value based on the acquired intensity and frequency readings.

16. The method of claim 15 wherein calculating the safety factor output comprises:
   determining a safety factor reading based on the absolute magnitude of the leakage electromagnetic field intensity and the frequency of the leakage electromagnetic field;
   determining a ratio of the safety factor reading to the safety factor threshold value; and
   calculating the safety factor output based on the ratio of the safety factor reading to the safety factor threshold value.

17. The method of claim 14 further comprising causing the leakage electromagnetic field sensing device to trip when the safety factor output is at or greater than a specified safety factor value, so as to provide self-protection of the leakage electromagnetic field sensing device.

18. The method of claim 14 wherein measuring the intensity and frequency of the leakage electromagnetic field comprises measuring the intensity and frequency of a leakage electromagnetic field generated by operation of electrical inductive equipment.

19. The method of claim 14 wherein illuminating the visual indicator comprises causing a light emitting diode (LED) display to illuminate in one of the plurality of colors based on the value of the safety factor output.

20. The method of claim 14 wherein illuminating the visual indicator in one of the plurality of colors comprises:
   illuminating the visual indicator in a first color when there is no leakage electromagnetic field measured;
   illuminating the visual indicator in a second color when the measured intensity and frequency of the leakage electromagnetic field does not interfere with operation of the electronic device;
   illuminating the visual indicator in a third color when the measured intensity and frequency of the leakage electromagnetic field interferes with operation of the electronic device; and
   illuminating the visual indicator in a fourth color when the measured intensity and frequency of the leakage electromagnetic field interferes with operation of the electromagnetic field sensing device.

* * * * *